United States Patent [19]

Varadi

[11] 4,056,405
[45] Nov. 1, 1977

[54] PANEL FOR SOLAR ENERGY CELLS

[75] Inventor: Peter F. Varadi, Rockville, Md.

[73] Assignee: Solarex Corporation, Rockville, Md.

[21] Appl. No.: 684,848

[22] Filed: May 10, 1976

[51] Int. Cl.² .......................................... H01L 31/04
[52] U.S. Cl. ............................ 136/89 PC; 136/89 H
[58] Field of Search ............. 136/89 H, 89 SA, 89 P, 136/89 PC

[56] References Cited

U.S. PATENT DOCUMENTS

| 2,989,575 | 6/1961 | Wallace, Jr. | 136/89 |
|---|---|---|---|
| 3,375,141 | 3/1968 | Julius | 136/89 |
| 3,427,459 | 2/1969 | Truffert | 250/209 |
| 3,982,963 | 9/1976 | Mahoney et al. | 136/89 |
| 3,999,283 | 12/1976 | Dean et al. | 29/572 |
| 4,002,031 | 1/1977 | Bell | 60/641 |
| 4,003,756 | 1/1977 | Abrams | 136/89 PC |

Primary Examiner—John H. Mack
Assistant Examiner—Aaron Weisstuch
Attorney, Agent, or Firm—Watson, Cole, Grindle & Watson

[57] ABSTRACT

A panel for mounting solar energy cells, and particularly those cells upon which light is to be concentrated, includes an enclosure for holding the cells and has at least one wall formed from a good conductor of heat. The cells are mounted within the enclosure on a resinous cushion that is a relatively good conductor of heat and a poor conductor of electricity, so that when heat is generated by impingement of light on the cells, it will be carried by the cushion to the enclosure wall and dissipated therefrom.

10 Claims, 3 Drawing Figures

U.S. Patent Nov. 1, 1977 4,056,405
FIG. 1
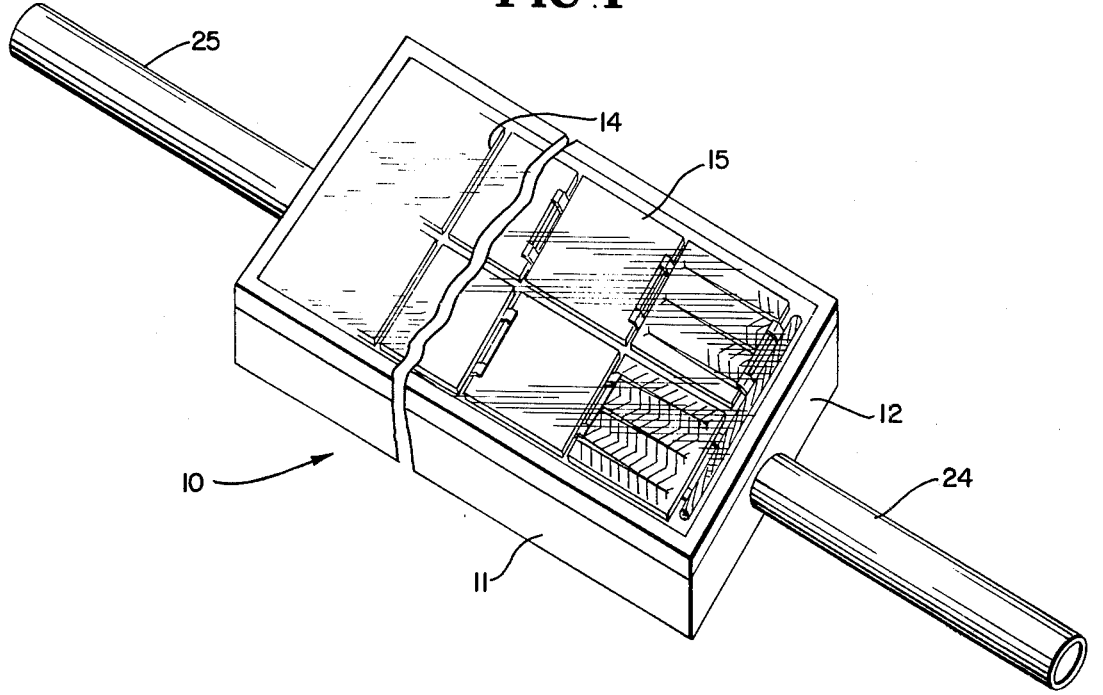
FIG. 2
FIG. 3
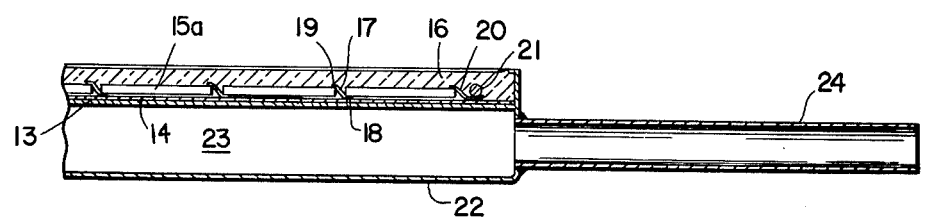

PANEL FOR SOLAR ENERGY CELLS

BACKGROUND OF THE INVENTION

The present invention relates in general to panels or housings for solar energy cells. More particularly, it relates to panels in which the solar energy cells are mounted for exposure to light while being protected from deleterious environmental conditions.

Solar energy cells are semiconductor devices used to convert light into electricity. Generally, once solar energy cells are exposed to light, they develop a voltage across their terminals and a consequent flow of electrons, such flow being related to the intensity of the light impinging on the photovoltaic junction formed at the surface of the cell. Where a plurality of cells are utilized, they are interconnected in such size and number to produce the desired voltage required for operation of the load or for battery storage. During their exposure to light, which is ordinarily sunlight, the cells and the panels in which they are housed often experience an increase in temperature, such rise in temperature being due to the heat generated by the light impinging on the cell. Under normal operation, solar cells have a lower efficiency at higher temperatures. Consequently, a decrease in efficiency is often effected by the increased temperatures. Thereby, despite the strong light concentration, the output is lower than expected upon direct exposure of cells to high light levels.

While a slight decrease in efficiency of operation of solar energy cells exposed to high light intensities may be tolerable in some instances, it is nevertheless desirable to cool the cells by some means. This is especially true if the solar cells are to be exposed to light intensities greater than one sun. This is the case when light concentrators are utilized. Such concentrators may be lenses, mirrors, or other means used to focus light from the sun. When the light rays are concentrated and are directed or reflected on the cells, an increased flow of electrons results.

The use of concentrators to focus the light on solar energy cells results in a magnification of the problem that might, under circumstances where no concentrators are utilized, be tolerable. Thus, if a concentrator is capable of increasing the light intensity from the sun on a solar energy cell by a multiple of three, then the electricity that the cell generates from such light will be substantially increased, optimally by the same factor of three. Under such conditions, however, the temperature of the cell will rise considerably and there will be a corresponding decrease in cell efficiency. As a result, particularly when concentrators are used but also when optimum efficiency is necessary for solar cells exposed only to ambient light, it is highly desirable to cool the cells, and thereby maintain maximum cell efficiency.

It is, therefore, a primary object of the present invention to produce a solar energy cell panel that will enable heat generated by impingement of light on the cells to be rapidly dissipated from the immediate environment of the cells while concomitantly failing to conduct electricity generated by the cell junctions away from the cells. In this manner, the loss of electricity generated is made minimal while the transfer of heat away from the cells—and consequent loss of efficiency by the cells—is maximized.

It is another object of the present invention to provide a panel for mounting solar energy cells in which the cells will be protected from environmental conditions.

It is still another object of the present invention to provide for a dual generation of energy from the sun's rays: the generation of electricity by photovoltaic cells and the simultaneous generation and conduction of heat away from the immediate environment of the cells to a location at which such heat can be utilized.

The present invention is a panel on which solar energy cells are mounted for exposure to light. Basically, it comprises an enclosure or housing for holding the cells, which enclosure or housing has at least one wall formed from a good conductor of heat. Generally the entire enclosure will be formed from a heat conductive metal, although such is not necessarily requisite. Within the enclosure is a somewhat resilient, resinous cushion that is a relatively good conductor of heat and a relatively poor conductor of electricity. That cushion occupies a substantial portion of the interior of the enclosure and has at least one surface in heat transfer position with respect to the enclosure wall that is formed of the good conductor of heat. Another surface of the cushion is substantially unobstructed to the impingement of light thereon.

Solar energy cells, which ordinarily are utilized in multiples of cells but may be a single cell, are secured to the cushion at the surface thereof that is exposed to light. In this way, light that impinges on the cells will generate a flow of electricity that is directed away from the cells and either stored or used to operate equipment, and heat generated by the light impinging on the cells and on the panel itself will be conducted by the cushion to the wall of the enclosure that is a good conductor of heat and, if desired, away from that wall by other means. Such further means may desirably include a conduit, one of the walls of which is formed by the other side of said heat-conductive enclosure wall. With inlet and outlet ducts, the conduit can be utilized to pass fluids, e.g. air or water, into and out of contact with the other side of the heat-conductive enclosure wall, and heat will thereby be removed from the wall. Particularly, for example, when the fluid is water or some other conductor of heat, the heat so generated may be stored or put to other use, so that by this particular construction both heat and electricity generated by impingement of light on solar energy cells and their mounting structure will be put to desired uses.

In order to protect the cells from the environment, the light-impinging surfaces of the cells are protected by a material that will be transparent to the passage of light, yet will furnish a shield against wind, rain, dust particles and the like. Consequently, in one embodiment of the invention, silicone rubber has been used to form a protective sheet over the cells. In order to ensure stability of the cells so far as motion is concerned, they are generally adhered at their exposed junction surface to the silicone rubber protective sheet, and at their opposite surface to the resinous cushion on which they are mounted. In such position the cells will be substantially protected from ambient conditions, yet be capable of functioning at a high efficiency even when light greater than one sun is directed on their photovoltaic junctions.

These and other objects, features and advantages of the present invention will become more apparent when the foregoing disclosure is considered in connection with a preferred embodiment of my invention, which is illustrated in the accompanying drawings and described hereinafter, and in which:

FIG. 1 is a perspective view of a preferred embodiment of the panel, broken away to show portions thereof;

FIG. 2 is a top plane view of the panel of FIG. 1, and

FIG. 3 is a vertical sectional view taken along line 3—3 of FIG. 2.

Referring now to the drawings and more particularly to FIGS. 1 and 2, the preferred embodiment of my invention includes a copper enclosure indicated generally by the reference numeral 10, which is formed with side walls 11 and end walls 12 and either side thereof. As shown in that portion of FIG. 1 that has been broken away, there is an intermediate wall parallel to the top and bottom planes of the enclosure 10, such intermediate wall being identified by reference number 13. Occupying a substantial portion of the space formed by the intermediate wall 13, side walls 11 and end walls 12 with the top plane of the enclosure is a somewhat resilient cushion 14 on which silicon solar energy cells 15, connected in series, are mounted and to which they are secured.

In this preferred embodiment and best mode of carrying out my invention, the resilient cushion is formed from an epoxy resin. Specifically, I have used Reapoxy No. 77, manufactured by Read Plastics, Inc., Rockville, Md., as the epoxy resin, which is hardened with Reapoxy Hardner A. That epoxy resin is, prior to hardening, mixed on an equal weight basis with aluminum powder, i.e., 6 parts of resin, 1 part of hardener and 7 parts of powder. For the aluminum powder I have used that marketed by Fisher Scientific Co. under the designation A-559, which is believed to have a particle size of about 0.5 to 50 microns in diameter. The hardener, resin and aluminum powder, which is commercial powder that has a coating of $Al_2O_3$, all mixed together for about 5 minutes then spread in a layer of about 1/64 inch in thickness on the upper surface of the intermediate wall 13 of the enclosure 10. The resin - aluminum mixture is allowed to set at room temperature for about 2 hours and is then cured in a 200° C oven for another hour.

In order to apply the silicon solar energy cells to the now-cured layer of resinous cushion material 14, the same mixture of epoxy resin and aluminum is applied to the back of each cell. The cell is then pressed down on the cured layer until the mix is evenly distributed over the back of the cell. Any excess aluminum-resin from the cell back is now removed. Then, with the cells in position on the resinous layer 14, the cells are cured in a 150° C oven for one half hour. After this further curing, the cells will be firmly adhered to the resinous cushion 14.

As will be more clearly apparent from FIG. 3 of the drawings, the cells as mounted on the resinous layer 14 are protected from ambient conditions by a coating 16. In the preferred embodiment of my invention, I have used silicon rubber, and more specifically a rubber manufactured by Dow-Corning under the trademark Sylgard 182 in order to encapsulate and protect the cells. With the cells adhered to the resinous cushion 14, the silicone rubber is poured into the enclosure almost to the top plane of the enclosure formed by the side walls 11 and end walls 12. Then a two-hour waiting period ensues until all the air bubbles have been removed from the silicone rubber, after which it is cured under a heat lamp at 120° L for one half hour.

As now mounted and protected, solar cells 15 are connected in series by wires 17, which as illustrated best in FIG. 2, are two in number. These connector wires 17 at portion 18 (FIG. 3) connect the lower terminals of each solar cell with the upper terminals of the adjoining cell at portion 19. At their ends, the series of solar cells are connected by terminal wires 20 to buss bars 21, where the electricity generated is collected for transport to the location of use by known means.

With specific attention to FIG. 3, the remainder of the structure of the panel, particularly that portion of the enclosure by means of which the intermediate enclosure wall 13 may be cooled, will be most apparent. It will there be seen that the enclosure is formed with a bottom wall 22, attached at its lowermost portions to side walls 11 and end walls 12. A conduit or contact area is formed in the enclosure between intermediate wall 13 and bottom wall 22, which walls are substantially parallel to each other. This conduit, identified by reference numeral 23, is connected at one end to inlet duct 24 and at the other end, see FIG. 1, to outlet duct 25. As will be apparent from the structure illustrated, a fluid, e.g. water or air, may be introduced into conduit 23 through inlet duct 24 and, according to the degree of heat transfer deemed optimal, maintained in contact with the lower surface of intermediate wall 13 for a desired period of time. Then, the fluid is withdrawn from conduit 23 through outlet duct 25.

When the fluid used is water, the water will be heated, since there is a transfer of heat generated at the upper surface of the cell 15. That heat is then transferred by the aluminum-epoxy cushion to the intermediate wall 13, and from the intermediate wall 13 to the bottom surface thereof to the water. The hot water so produced may be utilized, if desired, with the electricity produced by the junction at the surfaces 15a of the cells. Consequently, the conduit 23 holding the fluid to be circulated therein can have an additional function of storing energy in the form of heat in that fluid, as well as merely circulating the fluid and thereby removing heat from the vicinity of the solar cells.

It will be apparent that what has been described hereinfore is a preferred embodiment of my invention, and that all possible variations in that invention have not been described, but merely the best mode presently known to me. By way of example, finely divided beryllium oxide may be substituted for the aluminum powder used in the epoxy resin; the aluminum powder is preferred but not necessarily the only material that can be utilized to accomplish this function of heat transfer but not electricity transfer. Of course, fluids other than air and water, e.g. fluids that have a greater affinity for conducting heat, can be utilized. Further, while in my embodiment the entirety of the enclosure, including all the walls, are made of copper, the enclosure need not be formed from just one metal or materials, but different materials can be utilized in accordance with which wall or walls of the enclosure are desired to transfer the most heat. Thus, the end walls 12 and the side walls 11 of the enclosure may be formed from a material that is a poor conductor of heat so that the intermediate wall 13 will be the sole recipient of heat generated by the impingement of light on the cells 15.

It is, therefore, desired that the present invention not be limited to the embodiment specifically described, but that it include all such modifications and variations as would be obvious to thos of ordinary skill in this art. The scope of my invention should be determined by the equivalence of the various terms as recited in the following annexed claims.

I claim:

1. A panel for mounting solar energy cells for exposure to light in a terrestrial environment while mitigating impairment of cell efficiency due to excessive heat generated by the light, comprising
   a. a housing for retaining the cells, said housing comprising side and end walls and a wall intersecting said side and end walls and forming an upwardly open recessed top to said housing, said intersecting wall being formed from a good conductor of heat,
   b. a sheet of resilient resinous cushion material that is thermally conductive but has electrically insulating properties, said sheet overlaying said intersecting wall and being in heat-transfer position therewith, and having an outwardly facing surface, and
   c. a plurality of solar energy cells, each of which has a top surface adapted to absorb light impinging thereon and a bottom surface, said cells being secured to said outwardly facing surface of said cushion at their bottom surfaces and, as so secured, being in a position whereby light impinging on the junctions of said cells will generate a flow of electricity that will not be dissipated by said cushion, but heat generated by said light will be carried by said cushion from the immediate vicinity of said cells and transferred to said heat-conductive intersecting wall.

2. A panel as claimed in claim 1, in which said cushion is composed of an epoxy resin having aluminum powder distributed substantially uniformly throughout the cushion.

3. A panel as claimed in claim 2, in which said epoxy resin is stable at 200° C and said aluminum powder has a coating of aluminum oxide.

4. A panel as claimed in claim 1, in which said panel further includes a sheet of transparent material secured within said housing and overlying said cells and said outwardly facing surface of said cushion, and protecting said cells from environmental conditions.

5. A panel as claimed in claim 4, in which said sheet is formed from silicone rubber and said cells and said cushion are adhered to said sheet.

6. A panel is claimed in claim 1, further including means for passing a fluid against said intersecting wall so that heat transferred to said intersecting wall is thereafter transferred to said fluid.

7. A panel as claimed in claim 6, in which said means for passing a fluid is part of said housing, said means forming a conduit through which said fluid may be conducted and passed in heat-transfer relationship against said intersecting wall.

8. A panel as claimed in claim 7, in which said means for passing a fluid comprises a bottom wall substantially parallel to said intersecting wall and likewise joined to said housing side and end walls and forming said conduit therewith, and inlet and outlet ducts formed in said side or end walls for transporting said fluid into and out of heat transfer relationship with said intersecting wall.

9. A panel as claimed in claim 8, in which said fluid passing means includes water.

10. A panel as claimed in claim 8, in which said fluid passing means includes air.

* * * * *